July 12, 1966 D. J. SHOMBERT 3,260,900
TEMPERATURE COMPENSATING BARRIER LAYER SEMICONDUCTOR
Filed April 27, 1961
Fig I
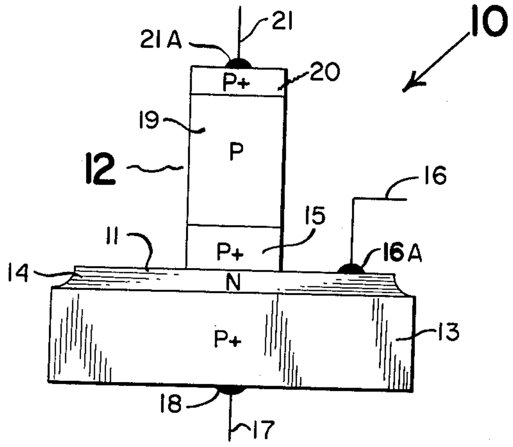
Fig 2
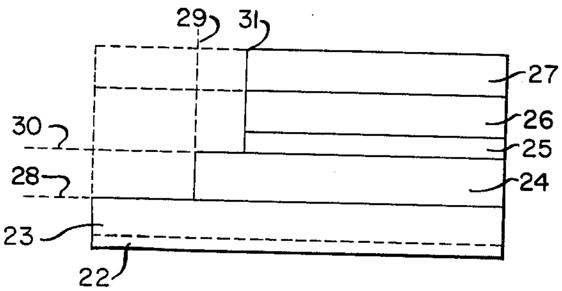
Fig 3
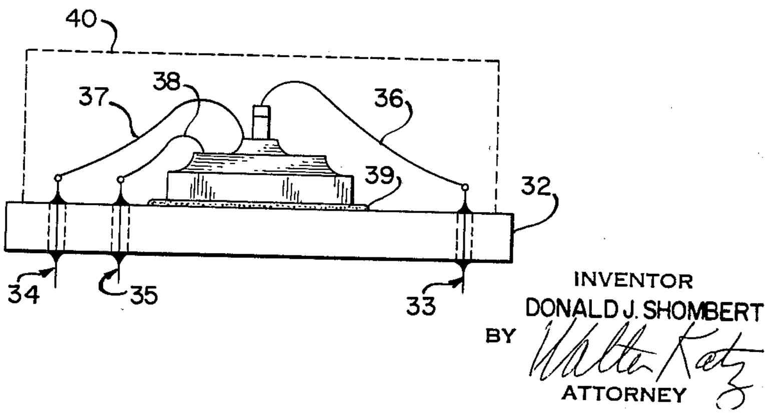
INVENTOR
DONALD J. SHOMBERT
BY Walter Katz
ATTORNEY

United States Patent Office 3,260,900
Patented July 12, 1966

3,260,900

TEMPERATURE COMPENSATING BARRIER LAYER SEMICONDUCTOR

Donald J. Shombert, Berkeley Heights, N.J., assignor to Merck & Co., Inc., Rahway, N.J., a corporation of New Jersey Filed Apr. 27, 1961, Ser. No. 105,923
1 Claim. (Cl. 317—234)

This invention relates to semiconductor devices and more particularly to improved temperature-compensated amplifier solid circuit structures.

It is known in the art that semiconductor junction devices are very susceptible to temperature changes because the voltage-current characteristics of the junction vary markedly with temperature. In particular, the reverse current leakage of a PN junction increases with increasing temperature. In the ultimate this effect can produce a thermal runaway and destruction of the operation of the device. At best, circuits employing semiconductor junction devices often must be designed to provide compensation for temperature-induced changes in the circuit.

One method of compensating for changes in the behavior of junction devices with temperature is to include in the circuit certain passive elements which are also temperature sensitive. For example thermistors are commonly used for this purpose; the resistance of a thermistor decreases with increasing temperature. Silicon resistors also have been used in the past as temperature compensating elements; their resistance increases with increasing temperature.

By use of illustration of temperature compensated semiconductor devices according to the present invention, and not as a limitation thereof, reference will be made in detail herein to a typical temperature compensated common-emitter transistor amplifier biased with a resistor in the emitter part of the circuit. In operation, an emitter current $I_E$ flows through the emitter resistor $R_E$ causing the emitter to be at a voltage $V_E$. The base voltage $V_B$ may be conveniently set by a pair of voltage divider resistors. Since the emitter and base constitute a forward-biased diode, the emitter potential $V_E$ is very close to the base potential $V_B$. When the ambient temperature of the device is increased, however, the emitter current also tends to increase for three reasons: (1) The emitter-base junction passes more current at the same voltage at the higher temperature, resulting in an increase in base current; this additional base current is then magnified by the current gain in the emitter circuit, (2) the current gain of the transistor likewise increases at higher temperatures thereby causing the emitter current to increase proportionately, and (3) the collector junction leakage current is greater at higher temperatures.

In order to compensate for these effects a silicon resistor temperature compensating element is used as the emitter resistor $R_E$. Thereupon, when the ambient temperature of the device is increased, the emitter resistance $R_E$ increases also. Thus the same emitter current $I_E$ flowing through a larger resistance $R_E'$ produces a larger emitter potential $V_E'$. This effect results in a decreased base-to-emitter voltage, i.e. $V_B - V_E$ is smaller. Accordingly the lower base-to-emitter voltage tends to bring the base current back to its low temperature value. The increased emitter resistance at the higher temperature also introduces more signal degeneration in the circuit and tends to keep the current gain more nearly constant. It will be apparent that the compensating effects described above in the case of an increase in ambient temperature of the device will function in a similar manner when the junction temperature is decreased.

From the foregoing it will be readily apparent to those skilled in the art that both the transistor and silicon resistor must be at the same local ambient temperature. In present day commercial devices, however, the junction is located inside a transistor mounting and the resistor is removed physically some distance therefrom. Thus at any given instant during operation, the two components very well may be at different temperatures. Therefore it is not surprising that such structures do not perform as fully temperature-compensated devices. It would be, therefore, of considerable advantage to provide a more nearly temperature-compensated solid circuit amplifier structure which includes a temperature-compensating transistor and resistor.

Accordingly, it is an object of the present invention to provide a temperature-compensated solid circuit structure wherein the temperature-compensating element is in contiguous physical relationship with other devices in the circuit.

Another object of the instant invention is to provide a temperature-compensated transistor amplifier solid circuit structure wherein a temperature-compensating resistor element and a transistor are in contiguous physical relationship whereby both components are at substantially the same ambient temperature.

A further object of the invention is to provide a common-emitter transistor amplifier solid circuit structure including a plurality of layers of vapor deposited semiconductor material arranged to form a transistor and a temperature-compensating resistor in contiguous physical relationship with each other wherein these layers are at substantially the same ambient temperature.

Other objects of the invention will be pointed out in the following description and claims and illustrated in the accompanying drawings, which disclose, by way of example, the principle of the invention and the best mode, which has been contemplated, of applying that principle.

In the drawings:

FIGURE 1 is a schematic illustration of the solid circuit structure of the present invention.

FIGURE 2 shows a preferred manner of forming the solid circuit structure of the instant invention.

FIGURE 3 is a final circuit structure.

A temperature-compensated amplifier in accordance with the present invention is constructed of layers of semiconductor material in contiguous physical relationship. The layers are assembled to include a transistor and a temperature-compensating resistor both of which thereby are at substantially the same ambient temperature.

Referring now to the drawings and more particularly to FIGURE 1 thereof, there is shown a schematic illustration of the temperature-compensated amplifier solid circuit structure 10 of the present invention. The structure 10 includes a transistor 11 and a temperature-compensating element such as an emitter resistor 19 in contiguous physical relationship. The transistor 11 includes a first layer 13 of semiconductor material which is preferably single crystalline and with provides the collector region of the transistor. Layer 13 suitably is of P-conductivity type and is preferably of low resistivity, in the order of .001 to .002 ohm-cm., thereby to enable ohmic contact to be easily made thereto.

The semiconductor amplifier structure in accordance with the present invention may be constructed of any semiconductor material presently known in the art. For example, the amplifier 10 may be constructed of silicon, germanium, silicon-germanium alloy, silicon-carbide, Group III–V intermetallic compounds such as gallium-arsenide, indium-phosphide, aluminum-antimonide, indium-antimonide and the like. However, for purposes of description only the present discussion of the semiconductor amplifier in accordance with the present invention will be given with particular reference to silicon as the semiconductor material.

Disposed contiguously with layer 13 is another layer 14 of semiconductor material of opposite conductivity type therefrom which forms the base region of transistor 11. Suitably layer 14 has a resistivity of about 2 to 5 ohm-cm. and a thickness of less than 0.5 mils. Affixed contiguous to layer 14 is another layer 15 of semiconductor material which provides the emitter region of transistor 11 and is of P+type conductivity with a resistivity of about .001 ohm-cm., the thickness of which is essentially about 1 mil. An electrical connector 16 is affixed to the base 14 by way of ohmic connection 16A, while an electrical connector 17 is affixed to the collector 13 by way of ohmic connection 18.

In the embodiment herein illustrated by way of example, a layer of semiconductor material 19 which provides an emitter resistor element is crystallographically interconnected in contiguous physical relationship with emitter layer 15 of transistor 11 and is of P—type conductivity. The resistance $R_E$ of layer 19 is predetermined by the total area of the amplifier and the thickness of the emitter resistor layer according to the equation: $R_E$=(resistivity of layer 19)×(thickness of layer 19)/(total area of device). For example, if layer 19 has a resistivity of 10 ohm-cm. and a thickness of 2 mils and the cross section area of the device is 4 mils square ($10^{-4}$ cm.$^2$), the emitter resistance $R_E$ is 500 ohms.

The amplifier 10 also may include an outer layer 20 of P+semiconductor material thereby providing a nonrectifying-nonresistive connection to which an additional electrical connection 21 is easily affixed through ohmic contact 21A.

Although for purposes of example FIGURE 1 illustrates a PNP transistor and a P-type emitter resistor, it should be expressly understood that a complementary structure also may be employed wherein an NPN transistor is utilized with an N-type emitter resistor. Also the collector layer may be $P+P$ (or $N+N$) with electrical connections made to the P+ or N+ side to form a PNIP or NPIN transistor.

A semiconductor amplifier in accordance with the present invention may be constructed in any manner which is desired. Such a semiconductor amplifier may be formed, for example, as follows. Silicon semiconductor material along with a first predetermined concentration of active impurity material is deposited upon a heated essentially single crystalline silicon semiconductor starting element 22 from a decomposable source thereof in a vacuum chamber. After a predetermined period of time during which the desired thickness of semiconductor material in layer 23 has been deposited, the concentration of the active impurity material within the decomposable source material is changed to provide a second layer of silicon semiconductor material 24 of opposite conductivity type. After a second predetermined period of time during which the desired thickness of the second layer of silicon semiconductor material has been deposited upon the first deposited layer of opposite conductivity type, the kind of active impurity material contained within the decomposable source is again changed to the original type conductivity impurity to provide a third layer 25 of semiconductor material having a conductivity like that of the first layer. After a third predetermined length of time during which the desired thickness of the third layer has been deposited the concentration of the active impurity material contained within the decomposable source is decreased to provide a fourth layer 26 of relatively high resisitivity silicon semiconductor material. A fifth layer 27 of low resistivity and of like conductivity type is then formed contiguous with the fourth layer. After fourth and fifth predetermined periods of time during which the desired thicknesses of the fourth and fifth layers have been deposited, the remaining source material and active impurity material is removed from the reaction chamber, the starting element with the five layers of material deposited thereon is permitted to cool and the resulting structure is then removed from the chamber.

After the structure has been removed from the reaction chamber, a semiconductor amplifier in accordance with the present invention may be constructed therefrom by making appropriate saw cuts thereby exposing certain regions of the structure where electrical connections are to be made in a preferred manner. As shown in FIGURE 2, saw cuts 28, 29, 30 and 31 provide the desired structure.

The amplifier structure of the present invention containing a transistor and a temperature stabilizing resistor in contiguous physical relationship may then be encapsulated and appropriately mounted. Accordingly, in this solid structure there will be substantial uniformity of temperature between the transistor and the silicon resistor which provides thereby a significant increase in the overall tempeaure-compensation and stability of the circuit. In addition, the size, weight and complexity of the circuit is substantially reduced.

Referring now to FIGURE 3 there is shown the solid circuit structure appropriately mounted as a commercial device. There is provided in such a structure a mounting base 32 having a plurality of insulated terminals 33, 34 and 35 for the emitter resistor lead 36, emitter lead 37 and base lead 38, respectively, which in turn are interconnected to their respective layers. The mounting base 32 is affixed to the P+ collector layer 13 by solder connection 39. The structure thus provided is then sealed in a case 40.

It will be understood by those skilled in the art that other amplifier circuits wherein a resistor is utilized as a temperature-compensating element, such as a common-collector and a common-base type amplifier structure may be treated in a similar manner to provide an improved temperature-compensated amplifier structure.

Also various features and concepts of the present invention have been setforth in the foregoing illustrative embodiment of the present invention and the invention is not to be limited in accordance therewith but is to be constructed in accordance with the claim set forth.

I claim:

A temperature-compensated semiconductor unitary solid circuit structure, comprising a semiconductor device having a plurality of layers of single crystalline semiconductor material in contiguous physical relationship and forming at least one PN junction between them and having an electrical resistance which decreases as its temperature increases; and a semiconductor resistor body in juxtaposition with a layer of said semiconductor device and forming one of said plurality of layers of said semiconductor device, said semiconductor resistor body having an electrical resistance which varies in a sense opposite to that of said semiconductor device and increases as its temperature increases, all of said layers being at substantially the same ambient temperature.

References Cited by the Examiner

UNITED STATES PATENTS

| | | | |
|---|---|---|---|
| 2,675,509 | 4/1954 | Barton | 317—235 |
| 2,502,479 | 4/1950 | Pearson et al. | 317—235 |
| 2,847,583 | 8/1958 | Chang Lin | 317—235 |
| 2,962,605 | 11/1960 | Grosvalet | 317—235 |

| | | | |
|---|---|---|---|
| 2,985,805 | 5/1961 | Nelson | 317—235 |
| 3,029,366 | 4/1962 | Lehovec | 317—234 |
| 3,056,100 | 9/1962 | Warner | 317—234 |

FOREIGN PATENTS

| | | |
|---|---|---|
| 426,517 | 4/1935 | Great Britain. |

JOHN W. HUCKERT, *Primary Examiner*.

GEORGE WESTBY, *Examiner*.

J. D. KALLAM, *Assistant Examiner*.